United States Patent [19]

Yasue

[11] Patent Number: 5,040,048

[45] Date of Patent: Aug. 13, 1991

[54] METAL INTERCONNECTION LAYER HAVING REDUCED HILLOCK FORMATION

[75] Inventor: Takao Yasue, Hyogo, Japan

[73] Assignee: Mitsubishi Denki Kabushiki Kaisha, Tokyo, Japan

[21] Appl. No.: 380,429

[22] Filed: Jul. 17, 1989

[30] Foreign Application Priority Data

Oct. 25, 1988 [JP] Japan .................................. 63-268664

[51] Int. Cl.$^5$ ..................... H01L 23/48; H01L 29/40; H01L 21/44
[52] U.S. Cl. ......................................... 357/67; 357/65; 437/957; 437/182
[58] Field of Search ..................... 357/67, 63; 437/957, 437/182

[56] References Cited

U.S. PATENT DOCUMENTS 4,942,138   7/1990   Miki ..................................... 437/957

FOREIGN PATENT DOCUMENTS

| 158649 | 12/1980 | Japan . |
| 183053 | 1/1982 | Japan . |
| 183054 | 11/1982 | Japan . |
| 183055 | 11/1982 | Japan . |
| 183056 | 11/1982 | Japan . |
| 0291147 | 12/1987 | Japan .................................... 357/67 |

OTHER PUBLICATIONS

"A Method for Eliminating Hillocks in Integrated Circuits Metallizations", J. Vac. Sci. Technol. B2(1), 1984, pp. 82–83.
"A Method for Eliminating Hillocks in Integrated-Circuit Metallizations", J. Vac. Sci. Technol. B2(1), 1984, pp. 82–83.
"The Importance of the Short-Circuit Failure Mode in Aluminum Electromigration", J. Vac. Sci. Technol., B5(6), 1987, pp. 169–173.

*Primary Examiner*—Rolf Hille
*Assistant Examiner*—Wael Fahmy
*Attorney, Agent, or Firm*—Lowe, Price, LeBlanc and Becker

[57] ABSTRACT

A semiconductor device having multilayer interconnections with reduced formation of hillocks is provided. An Al wiring layer formed on a substrate is patterned for Al wirings. Impurity ions such as Al, Ar, As, P and Sb or the like are implanted on the entire surface including sidewalls of the provided Al wirings. Such impurity ions are implanted to entire surface including sidewalls of the Al wirings, the grain size of granular material at sidewalls of the Al wirings can be made smaller than that of the granular material at inner portions of the metal wirings. As the grain size is reduced, the size of the generated hillocks is reduced. Consequently, short circuits between Al wirings in the same layer can be prevented, enabling provision of highly reliable and highly integrated semiconductor devices.

3 Claims, 10 Drawing Sheets

WAVE GENERATOR

FIG.9

WAVE GENERATOR

METAL INTERCONNECTION LAYER HAVING REDUCED HILLOCK FORMATION

BACKGROUND OF THE INVENTION

1. Field of the Invention

The present invention relates generally to reducing hillock formation in the metal interconnection layer of a semiconductor device, and more particularly, to reducing lateral formation of hillocks therein to prevent occurrence of short circuits between metal interconnection disposed on a common layer of high density integrated circuit device.

2. Description of the Background Art

Multilayer interconnections are indispensable to semiconductor devices such as LSIs to improve packaging density. A conventional method of manufacturing a semiconductor device having multilayer interconnections will be described in the following, with reference to a bipolar IC. FIGS. 1A to 1H schematically show the steps of manufacturing a conventional bipolar IC.

Figure 1A:
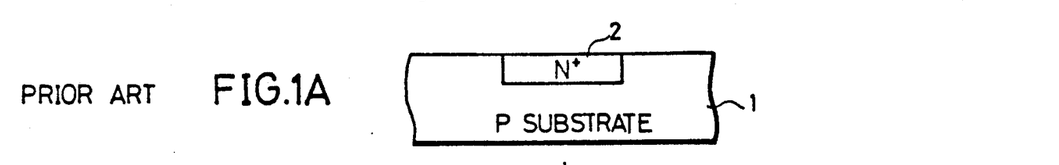
FIGS. 1A to 1H are cross sectional views showing the conventional steps of manufacturing the semiconductor device.

(1) Referring to FIG. 1A, an N+ buried layer 2 is diffused on a main surface of a P type semiconductor substrate, for example, in order to reduce resistance between the collector and emitter of a transistor.

Figure 1B:
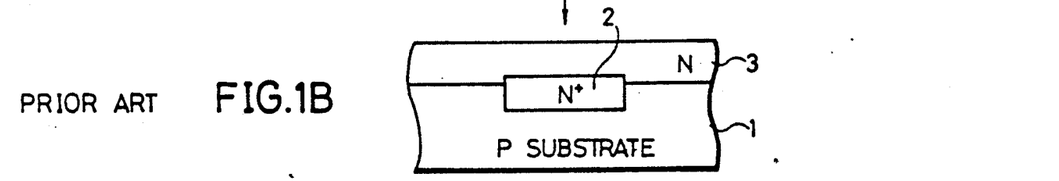

(2) Referring to FIG. 1B, an N layer 3 which will be the collector region of the transistor is formed on the main surface of the semiconductor substrate 1 by epitaxial growth.

Figure 1C:
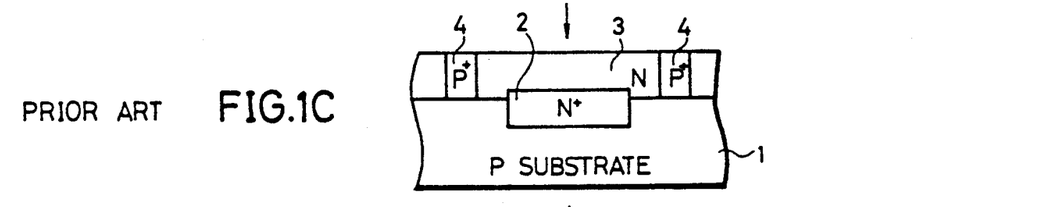

(3) An IC comprises a number of transistors and diodes. In order to electrically separate these elements from each other, P+ layers 4 are diffused into the N layer 3, as shown in FIG. 1C. In the present manufacture of MOS integrated circuit, it is the usual practice to separate active areas of the semiconductor by use of isolation oxide which is also referred to as field oxide. Normally, the P+ layers 4 are maintained at a lowest potential in the circuit, and the elements are separated from each other by applying a reverse bias to the diodes formed between N layer 3 formed in the step (2).

Figure 1D:
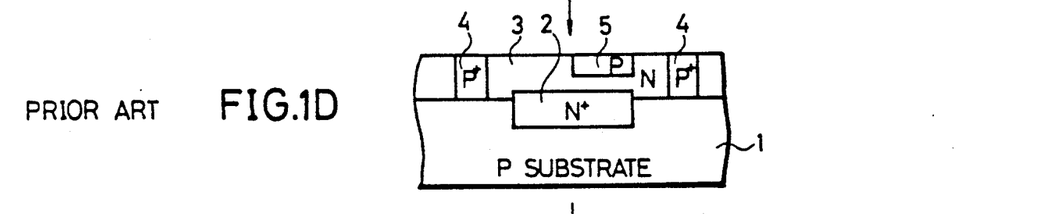

(4) Referring to FIG. 1D, a p layer 5 which will be the base region of an npn transistor is formed in the N layer 3. The p layer 5 is also used as a resistance in of the circuits in the IC.

Figure 1E:
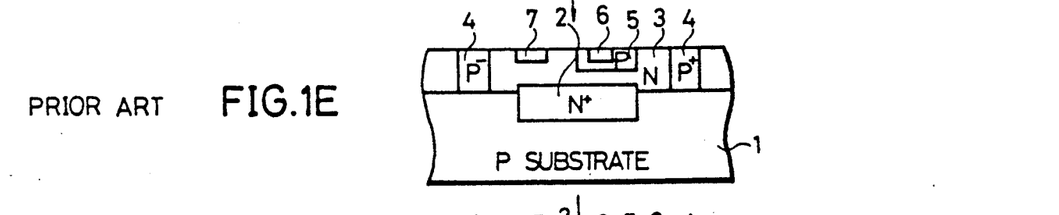

(5) Referring to FIG. 1E, an N+ layer 6 which will be the emitter region of the np transistor is formed in the p layer 5. At the same time, an N+ layer 7 which is necessary for taking out a collector electrode from the N layer 3 of the step (2) is formed.

Figure 1F:
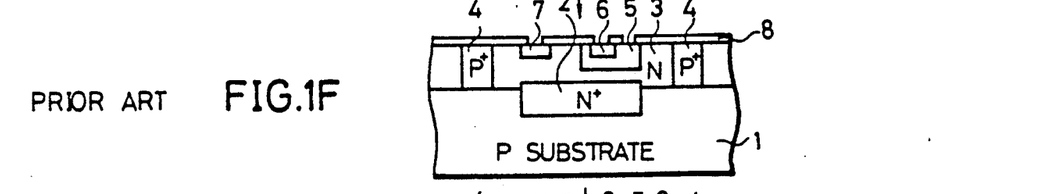

(6) The steps of diffusion necessary for the operation of the transistor are completed thus far. Thereafter, as shown in FIG. 1F, an oxide film 8 is formed on the entire surface and contact holes are formed at prescribed portions of the oxide film 8 so as to connect respective regions with Al wirings.

Figure 1G:
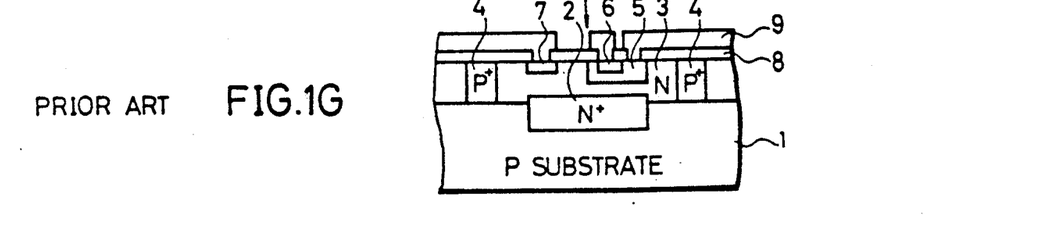

(7) Referring to FIG. 1G, the elements are connected by the Al wirings 9.

Figure 1H:
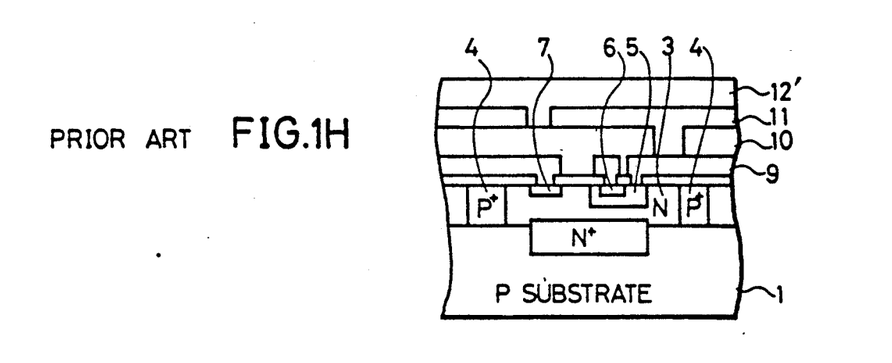

(8) Thereafter, as shown in FIG. 1H, an interlayer insulating film 10 is formed on the entire surface, if necessary, and contact holes are formed on prescribed portions of the interlayer insulating film 10 to provide Al wirings 11 of the second layer, and the surface of the chip may be covered by a passivation film 12' to improve resistance against moisture.

The conventional method of manufacturing semiconductor devices comprises the above described steps. Problems occurred during manufacturing of conventional semiconductor devices having multilayer interconnection will be described in the following.

Figure 2:
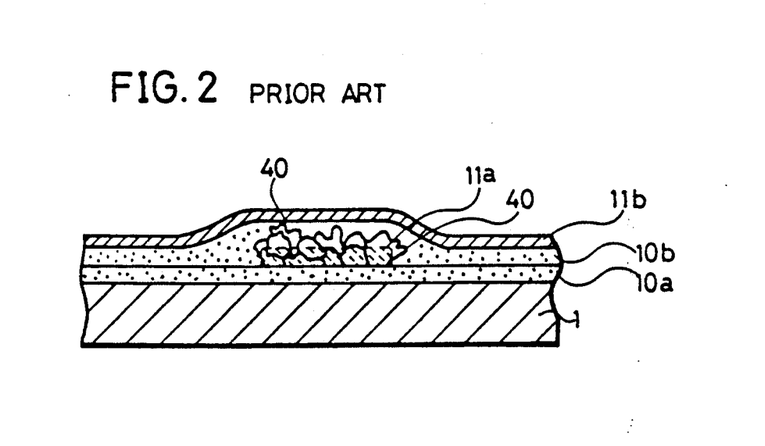
FIG. 2 is a schematic cross sectional view of a semiconductor device having multilayer interconnections.

FIG. 2 is a schematic diagram of a semiconductor device having multilayer interconnection provided through the above described method. Referring to FIG. 2, wirings 11a and 11b are formed on a semiconductor substrate 1 with insulating films 10a and 10b interposed therebetween. Hillocks 40 extending in the upward and lateral directions are generated on the wiring 11a. The hillocks 40 are generated during thermal processing of the wiring 11a. If the hillocks 40 extend much in the upward direction, the hillocks 40 may possibly be in contact with the wiring 11b, causing short circuits between interconnections. The short circuits between interconnections caused by hillocks have been a serious problem which decreases reliability of the devices.

Therefore, in providing multilayer interconnections, the size of the hillocks 40 generated on the underlying wiring 11a must be reduced in size. The size of the hillocks 40 must be in the range of about 0.1 to 0.5 μm in order to enable good interconnection.

Figure 3A:
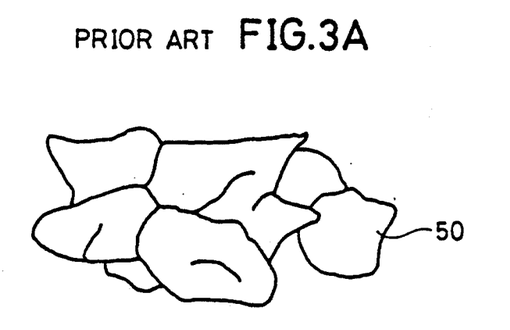
FIG. 3A shows, as a model, grains of aluminum.

How and why the hillocks are generated will be hereinafter described with reference to some articles. According to Japanese Patent Laying-Open No. 55-158649/1980, the vapor deposited aluminum is a granular material and is formed as an aggregation of large grains 50, as shown in FIG. 3A.

Figure 4:
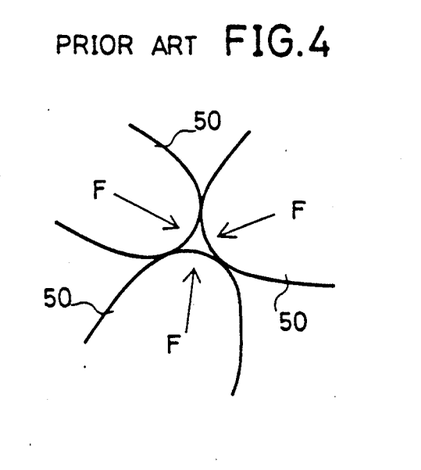
FIG. 4 illustrates the idea of the cause of generation of hillocks by heat.

The aluminum which is an aggregation of grains 50 is heated, a force is applied by the heat in the direction shown by the arrows F as shown in FIG. 4, so that the grains 50 are brought into strong contact with each other. Consequently, hillocks are generated from the grains 50. The size of the hillocks is relative to the size of the grains 50. Namely, the larger becomes the size of the grain 50, the larger becomes the size of the generated hillocks. The size of the grain 50 is normally 1 to 2 μm and hillocks of about 1 to 2 μm are generated from the grains 50 of this size. As described above, in order to provide good interconnections, the size of the hillocks must be about 0.1 to 0.5 μm.

Figure 3B:
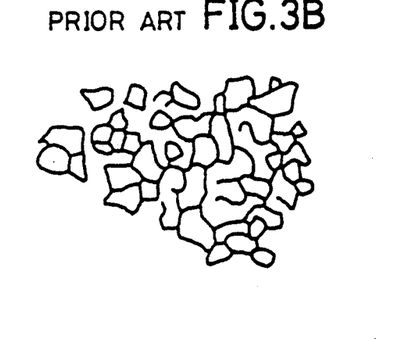
FIG. 3B shows, as a model, grains of aluminum broken into small pieces.

Therefore, it is assumed that the size of the generated hillocks will be small when the grains are broken to small pieces as shown in FIG. 3B to reduce the size of the grains.

Figure 5A:
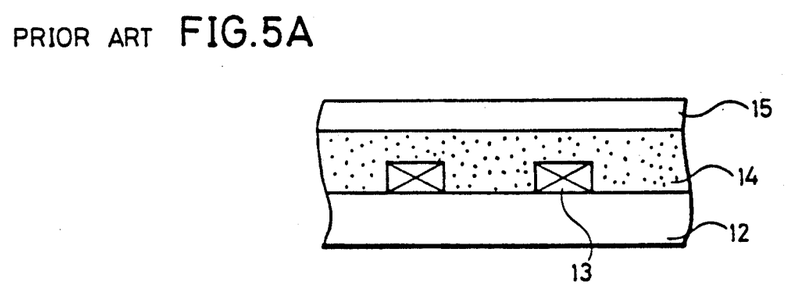
FIGS. 5A to 5C show the conventional steps for preventing the generation of hillocks.
Figure 5B:
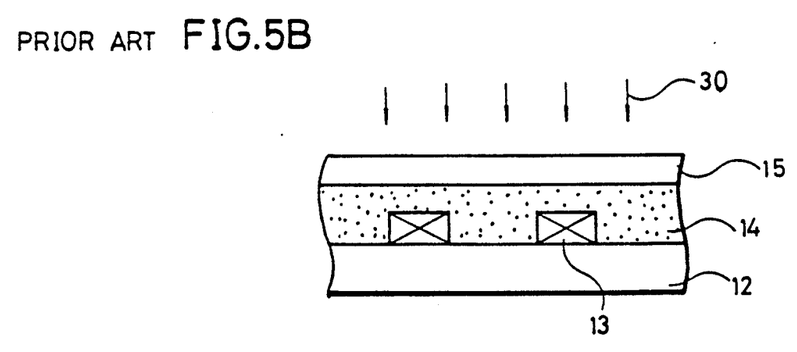
Figure 5C:
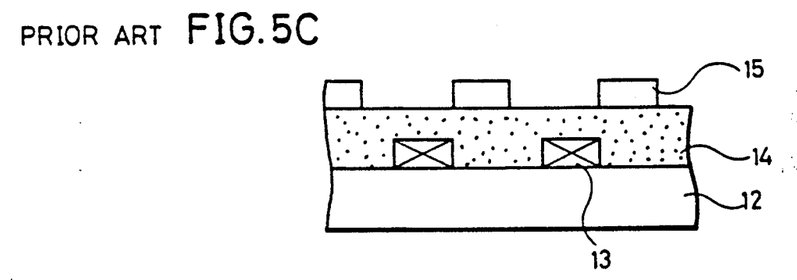

In view of the foregoing, the applicant of the present invention has proposed a method for breaking the grains into small pieces as shown in FIGS. 5A to 5C. The details of this process are disclosed in Japanese Patent Laying-Open No. 57-183053/1982, 57-183054/1982, 7-183055/1982 and 57-183056/1982. The conventional process of preventing generation of hillocks will be described in the following.

Referring to FIG. 5A, underlying wirings 13 are formed on the semiconductor substrate including devices, interlayer insulating film 14 is formed on the entire surface so as to cover the lower electrodes 13, and an upper layer Al wirings 15 are formed thereon.

Thereafter, referring to FIG. 5B, ion implantation 30 of Ar+, As+P+, Sb+ or the like is carried out on the surface of the Al wirings 15 prior to the patterning of the same. By the ion implantation, the grains of aluminum having large size (see FIG. 3A) are broken into small grains as shown in FIG. 3B.

Thereafter, patterning of Al wirings 15 is carried out, as shown in FIG. 5C.

In this prior art, the grains of aluminum is broken to be reduced in size by ion implantation, so that the size of the hillocks extending upward becomes small. Consequently, short circuits between different layers of interconnections can be prevented.

Now, as the degree of integration of semiconductor devices have been increased, short circuits in the same interconnecting layer caused by contacts between hillocks extending in the lateral direction have become a new problem.

In the process shown in FIGS. 5A to 5C, ion implantation 30 is carried out vertically from above the Al wiring 15. Therefore, the grains existing on the upper surface of the Al wirings 15 are reduced in size, and accordingly, the hillocks extending upward are also reduced in size. However, the size of the hillocks extending in the lateral direction from the side walls of the Al wirings 15 could not be made small. Therefore, short circuits between Al wirings in the same layer could not be prevented by the above described process, so the problem remains unsolved, reducing the reliability.

SUMMARY OF THE INVENTION

One object of the present invention is to prevent lateral formation of hillocks in the metal wiring strips of a semiconductor device.

Another object of the invention is to reduce grain size at the sidewall surface of metal wiring strips in a semiconductor device, to prevent lateral formation of hillocks thereon.

Another object is to prevent short circuits between metal wiring strips on a common layer on a semiconductor integrated circuit device by eliminating lateral formation of hillocks thereon.

Still another object is to eliminate lateral generation of hillocks on the sidewall surfaces of metal wiring strips in an integrated circuit device by implanting ions into the sidewall surfaces of said strips.

Another object is to prevent lateral generation of hillocks on metal wiring strips of a semiconductor device while maintaining a low resistance of the strips.

Still a further object of the invention is to prevent formation of both upper surface and lateral sidewall hillocks using a common processing step.

A further object of the invention is to provide a semiconductor integrated circuit device having high integration density metal wiring strips devoid of lateral hillocks.

A still further object of the invention is to provide a semiconductor integrated circuit having high integration density metal wiring strips devoid of both upper surface and lateral hillocks.

According to the present invention, a semiconductor device comprises a semiconductor substrate having at least one element formed thereon, and at least one conducting strip on the substrate connected to at least one said element, at least one conducting strip being made of a granular metallic material, wherein a grain size of the granular material in a sidewall portion of at least one conducting strip is less than that of the granular material in the inner portion of the strip whereby no lateral hillocks are formed thereon.

In accordance with another aspect of the invention, a semiconductor device comprises a semiconductor substrate having at least one element formed thereon, and at least one conducting strip on the substrate connected to at least one said element, wherein said at least one conducting strip being made of a granular metallic material, the strip having an inner portion and a peripheral portion surrounding said inner portion, wherein a grain size of the granular material is the peripheral portion of at least one conducting strip is less than that of the granular material in the inner portion of said strip whereby no upper surface of lateral hillocks are formed thereon.

In accordance with still another aspect of the invention, a semiconductor device comprises a semiconductor substrate having at least one element formed thereon, and at least one conducting strip on the substrate connected to at least one said element, at least one conducting strip being made of a granular metallic material and having an inner portion and a sidewall portion on opposite sides of said inner portion, wherein a grain size of the granular material in at least the sidewall portion of at least one conducting strip is less than approximately one micrometer whereby no significant lateral hillocks are formed thereon.

In accordance with another aspect of the invention, for a semiconductor device formed of a semiconductor substrate having at least one element thereon and at least one conducting strip on the substrate for connecting to at least one said element, wherein said conducting strip is made of a granular metallic material, the strip having inner and sidewall portions, and wherein hillocks tend to form on said conducting strip as a result of temperature variations imparted thereto, a method of preventing formation of the hillocks on the wiring strip, comprises the step of forming the grain size of the metallic material in at least the sidewall portions of the strip to have a size less than that in the inner portion of the strip.

In accordance with still further aspect of the invention, for a semiconductor device formed of a semiconductor substrate having at least one element thereon and at least one conducting strip on the substrate for connecting to at least one said element, wherein the conducting strip is made of a granular metallic material, said strip having inner and sidewall portions, and wherein hillocks tend to form on said conducting strip as a result of temperature variations imparted thereto, a method of preventing formation of said hillocks on the wiring strip, comprises the step of forming at least the sidewall portions of said strip to have a grain size of less than approximately one micrometer.

In accordance with a semiconductor device of the present invention, the size of grains of a granular material on the sidewalls of metal wiring strips is made smaller than the size of the grains of the granular material at inner portions of the said metal wiring strips, so that the hillocks generated from the sidewalls of the metal wiring strips can be reduced in size.

In accordance with a method of manufacturing a semiconductor device of the present invention, the size of the grains of a granular material on the sidewalls of metal wiring strips is made smaller than that of the granular material at inner portions of the metal wiring strips, so that the size of the hillocks generated from the sidewalls of the metal wiring strips can be made small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described in the following with reference to the figures.

Figure 6A:
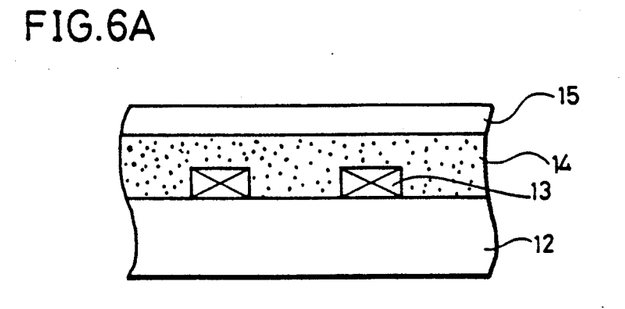
FIGS. 6A, 6B and 6C are cross sectional views showing main steps of manufacturing the semiconductor device in accordance with the present invention.
Figure 6B:
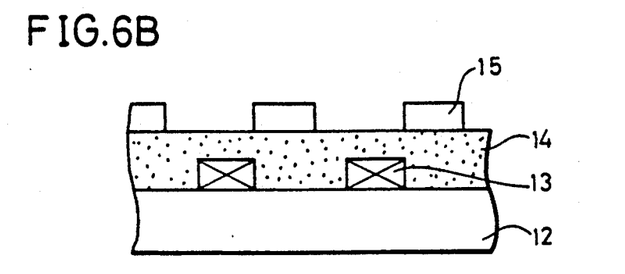
Figure 6C:
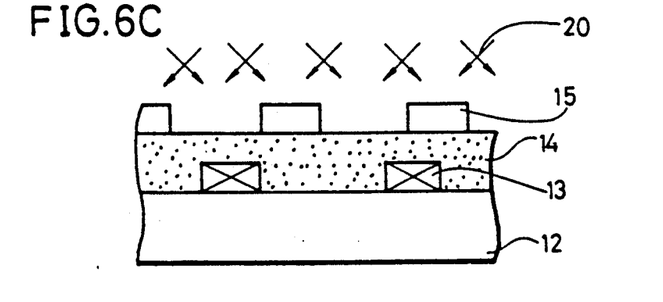

FIGS. 6A to 6C are cross sectional views showing the process of preventing generation of hillocks in accordance with the present invention.

Referring to FIG. 6A, lower layer wirings 13 are formed on a semiconductor substrate including devices, an interlayer insulating film 14 is formed on the entire surface to cover the lower layer wirings 13, and metal wirings, for example Al wirings 15 are formed thereon.

Thereafter, referring to FIG. 6B, the Al wirings 15 are patterned. In the conventional method, ion implantation was carried out before patterning. However, in the present invention, patterning is carried out before ion implantation.

Impurity ions such as $Ar^+$, $As^+$, $P^+$, $Sb^+$ and $Al^+$ are implanted on the entire surface including the sidewalls of the patterned Al wiring strip 15 by rotary ion implantation 20 as shown in FIG. 6C. Consequently, the large grains of aluminum on the upper surface and on the sidewall surfaces of the Al wiring strip 15 are broken to small grains. The resulting grains have the size of approximately 1 μm or less.

If the metal wiring strip is of Al and aluminum ion are used as impurity ions, the size of the grains can be reduced without changing the electric conductivity.

Figure 7:
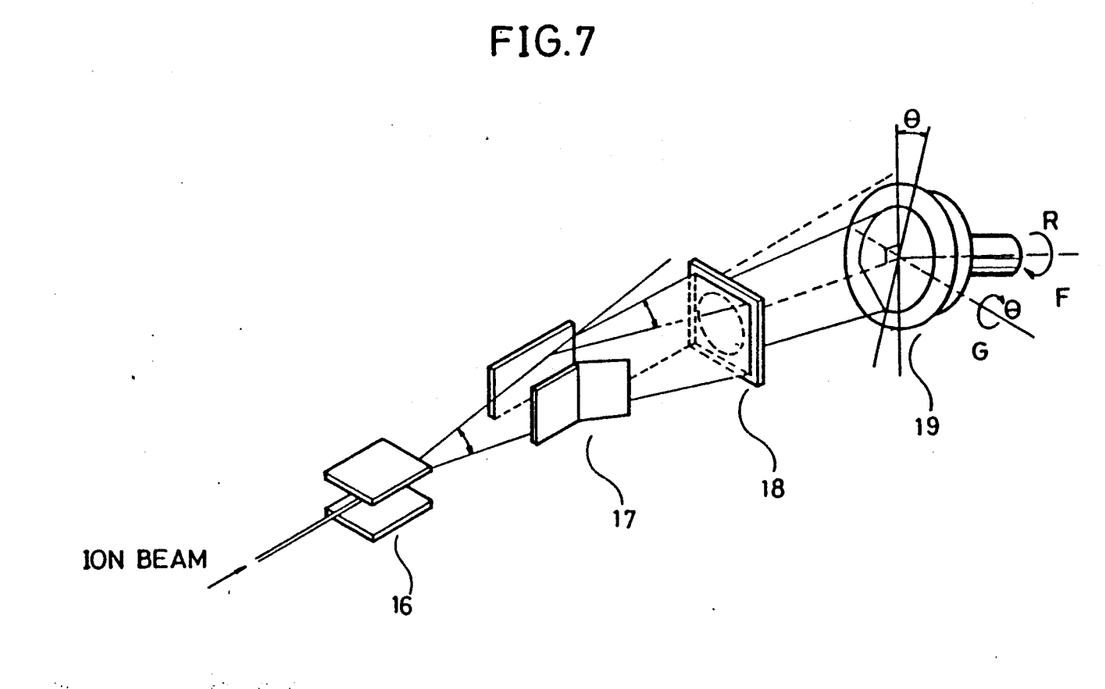
FIG. 7 shows an idea of a rotary ion implanting apparatus employed for the present invention.
Figure 8:
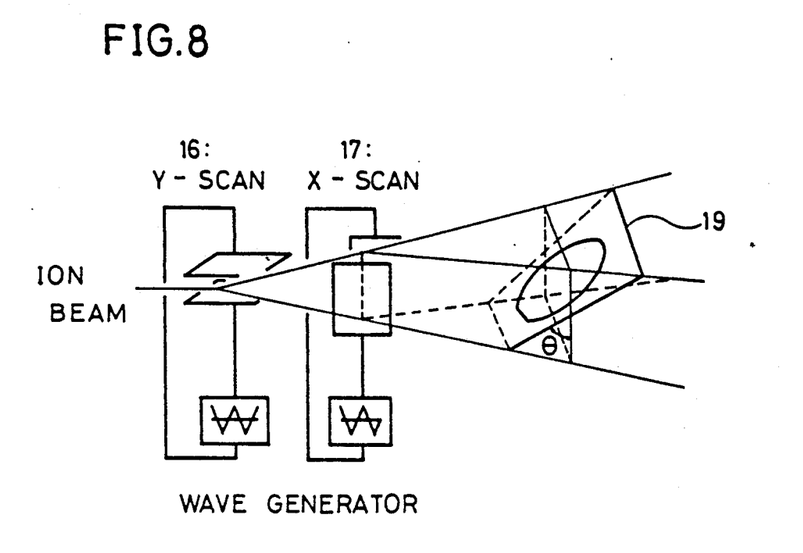
FIG. 8 shows schematically the apparatus of FIG. 7.
Figure 9:
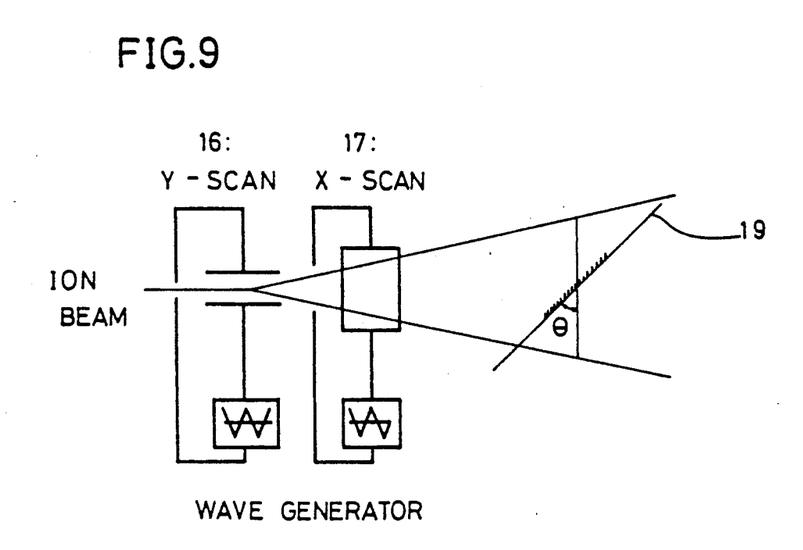
FIG. 9 is a side view of the apparatus shown in FIG. 7.
Figure 10:
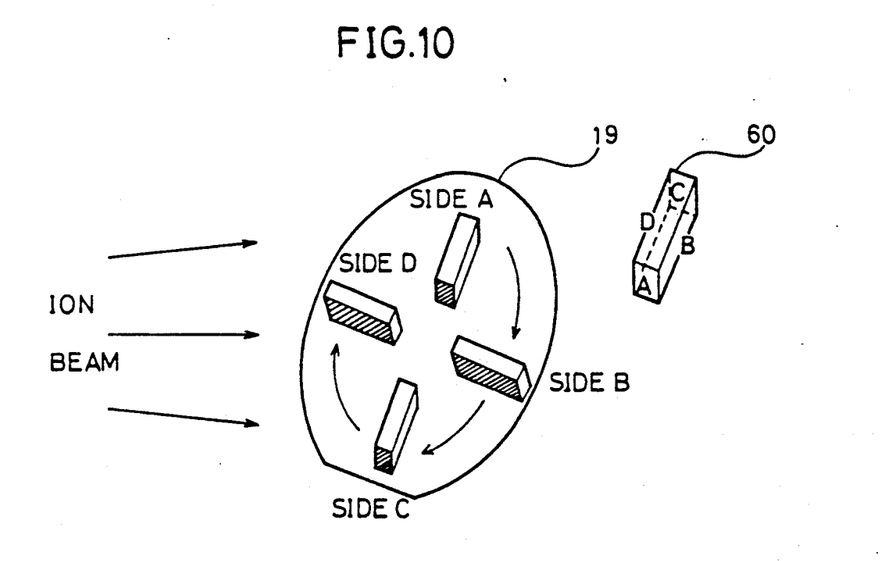
FIG. 10 illustrates irradiation of ions with an object placed on a rotary target.

FIG. 7 shows an idea of a rotary ion implanting apparatus used for the present invention. FIG. 8 schematically shows the apparatus of FIG. 7. FIG. 9 is a side view of the apparatus shown in FIG. 7. FIG. 10 illustrates ion irradiation on an object 60, with the object 60 mounted on a rotary target 19, and ion irradiation is carried out while rotating the rotary target 19. Referring to these figures, the rotary ion implanting apparatus comprises a Y deflecting plate 16, a X deflecting plate 17, a mask 18 and a rotary target 19. The rotary target 19 is adapted to be inclined in the direction of the arrow G. The angle of implantation of the impurity ions can be adjusted by changing the angle of inclination. The rotary target 19 is also adapted to be rotated in the direction of the arrow F, and the semiconductor substrate placed on the rotary target 19 is rotated in the direction of the arrow F.

A method of rotary ion implantation using the rotary ion implanting apparatus will be described in the following. First, the semiconductor substrate with patterned Al wirings (shown in FIG. 6B) is placed on the rotary target 19. Then, the rotary target 19 is inclined such that the angle of implantation $\theta$ becomes 45°, and the rotary target is rotated in the direction of the arrow F. Then, ion beam is emitted. The ion beam is extended in the vertical direction by the Y deflecting plate 16 and in the horizontal direction by the X deflecting plate 17 to irradiate the semiconductor substrate placed on the rotary target 19 through the mask 18. In this manner, impurity ions are implanted on the entire surface including the sidewalls of the patterned metal wiring strip, as shown in FIG. 10. Consequently, the grains positioned on the surfaces including sidewalls of the metal wirings are broken into small grains.

Conditions of the rotary ion implantation will be described.

Figure 11:
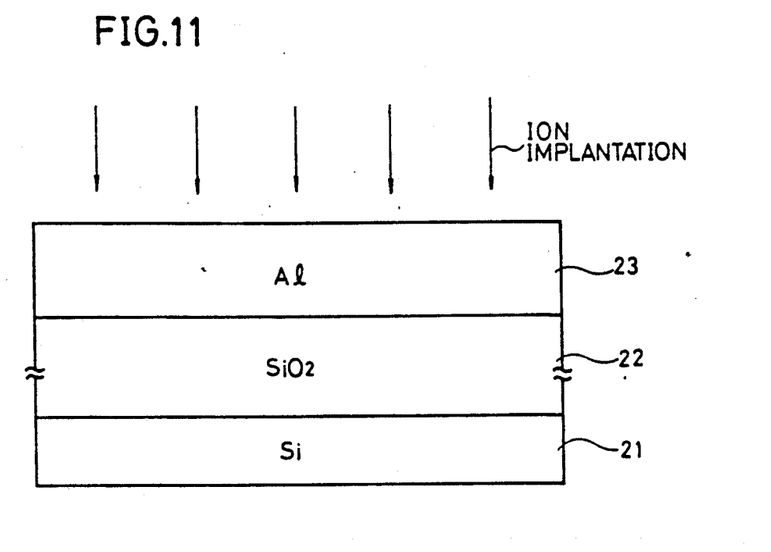
FIG. 11 is a cross sectional view showing a structure of a sample employed for finding conditions of rotary ion implantation.

FIG. 11 is a cross sectional view of a sample used to find conditions of the rotary ion implantation. Referring to FIG. 11, a silicon oxide film 22 is formed on the semiconductor substrate 21 including devices, and an Al film 23 as the metal wiring is formed, by spattering, on the silicon oxide film 22. The density of Al is $6.02 \times 10^{22}/cm^3$. The angle of implantation $\theta$ is selected to be 0° for convenience.

Figure 12:
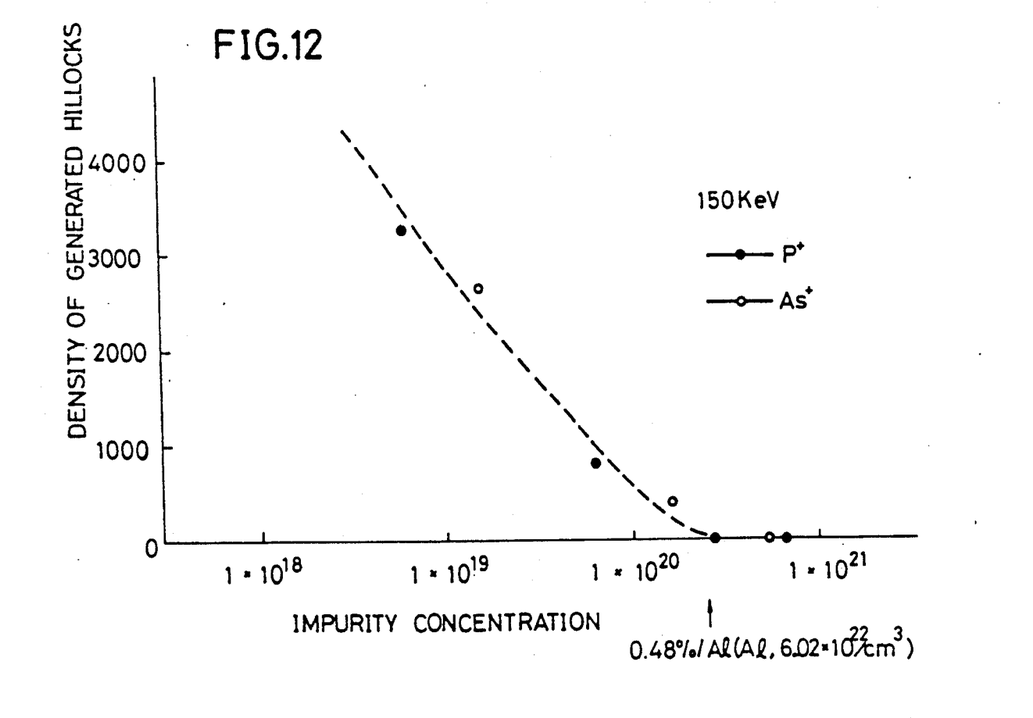
FIG. 12 is a graph showing a relation between the impurity concentration and the density of hillocks.

Impurity concentration:

FIG. 12 shows a relation between impurity concentration and the density of generated hillocks when impurities ($P^+$, $As^+$) of various concentrations are implanted into Al film 23. The abscissa represents the impurity concentrations ($N/cm^3$) of $As^+$ and $P^+$, and the ordinate represents the density of generated hillocks (per 1 $cm^2$). The term "hillocks" employed in the description of FIGS. 12 and 13 means hillocks larger than 1 μm. In this experiment, the sample of the structure shown in FIG. 11 is subjected to a repeated heat cycle between 300° to 25° so that the hillocks are generated in the Al film 23, and the relation between the density of the generated hillocks and the impurity concentrations of $As^+$ or $P^+$ implanted in the Al film is studied. According to FIG. 12, $P^+$ and $As^+$ show similar characteristics. For example, about 3,000 hillocks (per 1 $cm^2$) are generated when the impurity concentration is $1 \times 10^{19}$ ($N/cm^3$), and the density of generated hillocks reduces as the impurity concentration is increased. When the impurities are implanted to the concentration higher than $2.9 \times 10^{20}$ ($N/cm^3$), no hillock is generated. Therefore, in order to prevent the generation of hillocks, impurities such as $As^+$, $P^+$ and the like may be implanted to be the concentration of more than 0.5% of the Al film having the concentration of $6.02 \times 10^{22}/cm^3$. $Al^+$ and $Sb^+$ ions are implanted as impurities other than $As^+$ and $P^+$, and it turned out that they have the same effect. In that case, the impurity concentration should preferably be kept near 0.5% in order to maintain the resistance of Al film as it is.

Figure 13:
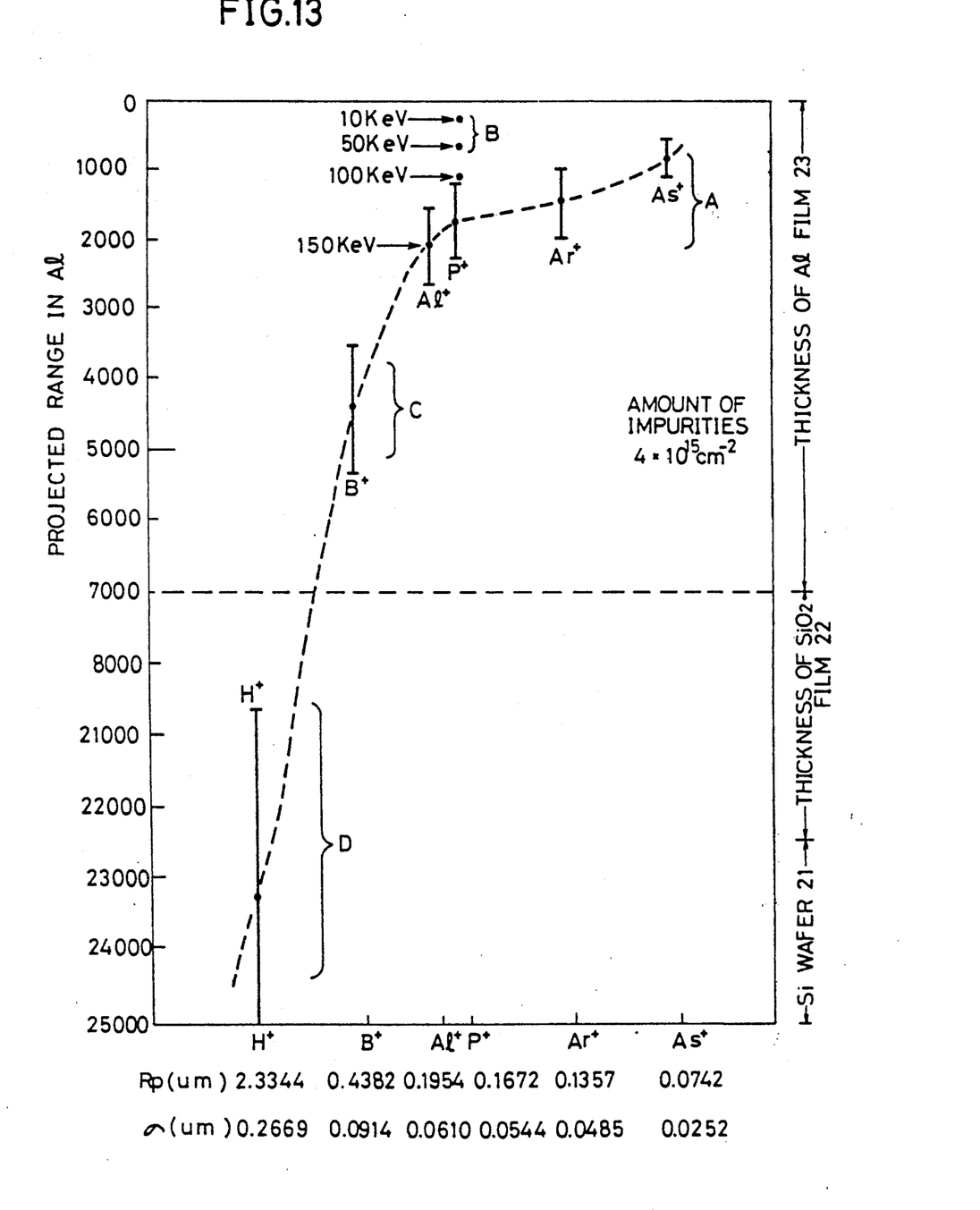
FIG. 13 is a graph showing a relation between the depths of ion implantation and the generation of hillocks.

Depths of ion implantation:

FIG. 13 is a result of experiment carried out to find the preferred depths of ion implantation to prevent the generation of hillocks, showing the relation between the generation of hillocks and the depth of the implantation. The structure shown in FIG. 11 is again used as the sample. The angle of implantation is selected to be 0° for convenience. The amount of dopant is $4 \times 10^{15}/cm^2$ for all examples.

In FIG. 13, the abscissa represents impurity ions and the ordinate represents the projected range (Rp) of the ions implanted in the Al film. The reference character $\sigma$ represents the value of standard deviation.

In this experiment, the sample of the structure shown in FIG. 11 is subjected to a repeated heat cycle between 300° to 25° C. so as to generate hillocks in the Al film 23. The correspondence between the density of the generated hillocks and the depth (projected range) of impurities such as $As^+$, $P^+$ or the like implanted in the Al film is studied. The depth of impurities enabling effective prevention of hillocks is found in this manner. According to FIG. 13, $P^+$, $Ar^+$ and $As^+$ show similar characteristics. When the ions are implanted to the depth of about 800 to 2,000 Å, as shown by the character A of FIG. 13, no hillock was generated. As for $P^+$, when ions are implanted to the depth of about 0.01 μm from the surface of the Al film 23 as shown by the character B in FIG. 13, hillocks are generated. As for $B^+$, when ion implantation is carried out with the energy of implantation being 150 keV and the amount of dopant being $4 \times 10^{15}/cm^2$, $B^+$ ions are implanted to the depths of 4,500 Å from the surface of the Al film 23 as shown by the character C of FIG. 13. However, hillocks are generated in this region. Therefore, impurities should preferably be implanted to the depth of 800 to 2,000 Å from the surface of the Al film 23 as shown by the character A in FIG. 13 in order to prevent generation of hillocks.

Ions of $Ar^+$ and $Sb^+$ are implanted as impurities other than $As^+$ and $P^+$, and it turned out that they have the same effect. When ions of $H^+$ are implanted under the same conditions, the ions of $H^+$ pass through the Al film 23 as shown by the character D in FIG. 13. Hillocks are generated in the region represented by the character D. Although the angle of implantation $\theta$ is 0° in the above experiment, the same result can be obtained with different angles of implantation $\theta$. However, in that case, the energy of implantation must be increased to some extent. More specifically, if the preferable energy of implantation is 150 keV with the angle $\theta$ being 0°, then the preferable energy of implantation with the angle being $\theta$ will be $150 \times 1/\cos \theta$ keV.

Although description was given of a case in which rotary ion implantation is carried out only to one layer of metal wirings in the foregoing, the present invention can be applied to metal wirings of two or more layers.

Although a bipolar IC is referred to in the specification, the present invention can be applied to all semiconductor devices using metal wirings.

The above description will be summarized in the following.

The semiconductor device in accordance with the present invention comprises a semiconductor substrate including devices and metal wirings formed on the semiconductor substrate. The metal wirings are patterned and impurity ions are implanted by rotary ion implantation to the entire surface including sidewalls of the patterned metal wirings, so that the entire surface including the sidewalls of the metal wirings are turned into amorphous.

Preferably, ions of an element selected from the group consisting of $Al^{30}$, $Ar^+$, $As^+$, $P^+$ and $Sb^+$ are used as impurity ions in the present invention. Preferably, the impurity ions are implanted to the depth of about 800 to 2,000 Å from the surface of the metal wirings.

In addition, the impurity ions should preferably be implanted to have the concentration of more than 0.5% of the metal wirings.

When aluminum or alloy including aluminum as a base material is used as the metal wirings and ions of $Al^+$ are used as impurities, hillocks are generated and, in addition, good metal wirings can be provided in which the electric conductivity is not changed.

The method for manufacturing the semiconductor device in accordance with the present invention comprises the steps of preparing a semiconductor substrate including devices, forming metal wirings on the semiconductor substrate, patterning the metal wirings and implanting impurity ions by rotary ion implantation to the entire surface including sidewalls of the patterned metal wirings so as to turn the surfaces of the metal wirings into amorphous.

In this method, the impurity ions are preferably implanted to the depths of about 800 to 2,000 Å from the surface of the metal wirings.

The impurity ions are preferably implanted to the metal wirings to have the concentration of more than 0.5% of the metal wirings.

The impurity ions are preferably ions of an element selected from the group consisting of $Al^+$, $Ar^+$, $As^+$, $P^+$ and $Sb^+$.

As described above, in accordance with the semiconductor device and the method of manufacturing the same in accordance with the present invention, the grain size of the granular material on the sidewalls of metal interconnections are made smaller than that of the granular material at inner portions of the metal interconnections, so that the hillocks generated from the sidewalls of the metal interconnections can be reduced in size. Consequently, short circuits between Al interconnections in the common layer can be prevented, providing semiconductor devices of higher integration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having at least one element formed thereon; and
   at least one conducting strip on said substrate connected to at least one said element;
   said at least one conducting strip being made of a granular metallic material;
   wherein a grain size of the granular material in a sidewall portion of said at least one conducting strip is less than that of the granular material in the inner portion of said strip whereby no lateral hillocks are formed thereon.

2. A semiconductor device, comprising:
   a semiconductor substrate having at least one element formed thereon; and
   at least one conducting strip on said substrate connected to at least one said element;

said at least one conducting strip being made of a granular metallic material and having an inner portion and a peripheral portion surrounding said inner portion;

wherein a grain size of the granular material in the peripheral portion of said at least one conducting strip is less than that of the granular material in the inner portion of said strip whereby no upper surface or lateral hillocks are formed thereon.

3. A semiconductor device, comprising:

a semiconductor substrate having at least one element formed thereon; and at least one conducting strip on said substrate connected to at least one said element;

said at least one conducting strip being made of a granular metallic material and having an inner portion and a sidewall portion on opposite sides of said inner portion;

wherein a grain size of the granular material in at least the sidewall portion of said at least one conducting strip is less than approximately one micrometer whereby no significant lateral hillocks are formed thereon.

* * * * *